(12) United States Patent
Ishiduki et al.

(10) Patent No.: US 8,581,329 B2
(45) Date of Patent: Nov. 12, 2013

(54) SEMICONDUCTOR DEVICE AND METHOD FOR MANUFACTURING SAME

(75) Inventors: Megumi Ishiduki, Mie-ken (JP); Ryota Katsumata, Mie-ken (JP); Tomo Ohsawa, Mie-ken (JP); Mitsuru Sato, Mie-ken (JP); Masaru Kidoh, Tokyo (JP); Hiroyasu Tanaka, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 13/236,723

(22) Filed: Sep. 20, 2011

(65) Prior Publication Data

US 2012/0235221 A1 Sep. 20, 2012

(30) Foreign Application Priority Data

Mar. 16, 2011 (JP) ................... 2011-057937

(51) Int. Cl.
*H01L 29/792* (2006.01)
*H01L 21/425* (2006.01)

(52) U.S. Cl.
USPC .............. 257/324; 438/530; 257/E29.309; 257/E21.473

(58) Field of Classification Search
USPC .................................. 257/324, 326
See application file for complete search history.

(56) References Cited

U.S. PATENT DOCUMENTS

| | | | |
|---|---|---|---|
| 7,732,891 B2 | 6/2010 | Tanaka et al. | |
| 7,847,342 B2 | 12/2010 | Fukuzumi et al. | |
| 7,902,591 B2 * | 3/2011 | Kito et al. | 257/324 |
| 7,936,004 B2 | 5/2011 | Kito et al. | |
| 2009/0146206 A1 * | 6/2009 | Fukuzumi et al. | 257/324 |
| 2010/0013049 A1 * | 1/2010 | Tanaka et al. | 257/532 |
| 2010/0109072 A1 * | 5/2010 | Kidoh et al. | 257/324 |
| 2010/0207195 A1 | 8/2010 | Fukuzumi et al. | |
| 2010/0213537 A1 * | 8/2010 | Fukuzumi et al. | 257/326 |
| 2010/0244119 A1 | 9/2010 | Fukuzumi et al. | |
| 2011/0031550 A1 | 2/2011 | Komori et al. | |

FOREIGN PATENT DOCUMENTS

| | | |
|---|---|---|
| JP | 2010-225946 | 10/2010 |
| JP | 2011-35228 | 2/2011 |
| KR | 10-2010-0106911 | 10/2010 |

OTHER PUBLICATIONS

Korean Office Action issued Sep. 13, 2012, in Korea Patent Application No. 10-2011-86493 (with English translation).
U.S. Appl. No. 13/419,984, filed Mar. 14, 2012, Sato et al.

* cited by examiner

*Primary Examiner* — Kimberly Rizkallah
*Assistant Examiner* — Mounir Amer
(74) *Attorney, Agent, or Firm* — Oblon, Spivak, McClelland, Maier & Neustadt, L.L.P.

(57) ABSTRACT

According to one embodiment, a semiconductor device includes a substrate, a first stacked body, a memory film, a first channel body, a second stacked body, a gate insulating film and a second channel body. A step part is formed between a side face of the select gate and the second insulating layer. A film thickness of a portion covering the step part of the second channel body is thicker than a film thickness of a portion provided between the second insulating layers of the second channel body.

11 Claims, 10 Drawing Sheets

SEMICONDUCTOR DEVICE AND METHOD FOR MANUFACTURING SAME

CROSS-REFERENCE TO RELATED APPLICATION

This application is based upon and claims the benefit of priority from the prior Japanese Patent Application No. 2011-057937, filed on Mar. 16, 2011; the entire contents of which are incorporated herein by reference.

FIELD

Embodiments described herein relate generally to a semiconductor device and a method for manufacturing the same.

BACKGROUND

A memory device has been proposed in which memory cells are arranged three-dimensionally by forming a memory hole on a stacked body having a plurality of electrode layers which function as a control gate in a memory cell and a plurality of insulating layers alternately stacked on each other, forming a charge storage film on a side wall of the memory hole, and thereafter providing silicon in the memory hole to serve as a channel.

As a data erase method specific to such a three-dimensional stacked memory, an erase method using Gate Induced Drain Leakage (GIDL) current is proposed. To use the erase method, a high-concentration impurity diffusion region is required on a channel body near the upper end of a select gate provided above the memory cells.

DETAILED DESCRIPTION

Figure 1:
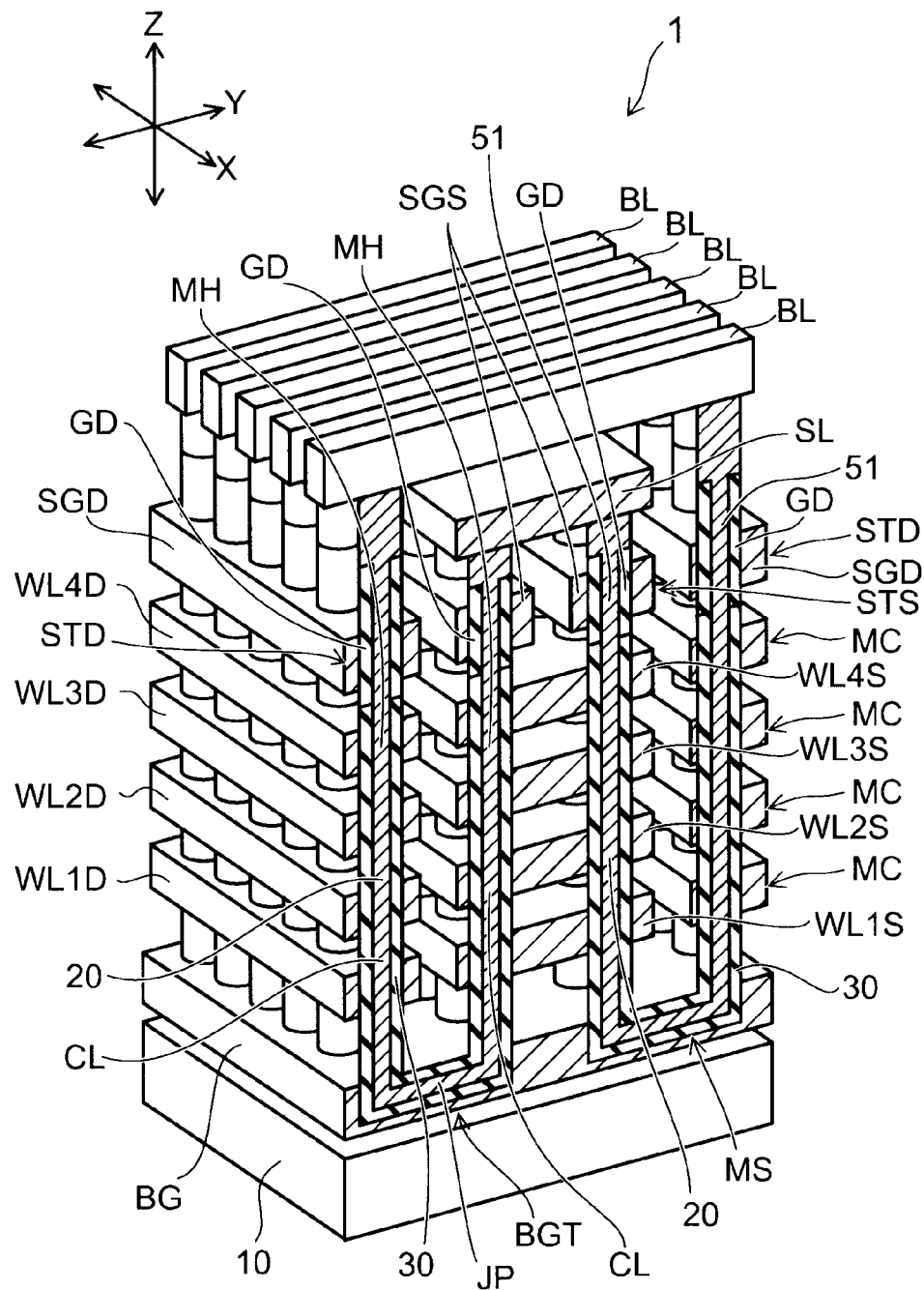
FIG. 1 is a schematic perspective view of a semiconductor device of an embodiment.

According to one embodiment, a semiconductor device includes a substrate, a first stacked body, a memory film, a first channel body, a second stacked body, a gate insulating film and a second channel body. The first stacked body includes a plurality of electrode layers and a plurality of first insulating layers alternately stacked on each other on the substrate. The memory film is provided on a side wall of a first hole formed through the first stacked body in a stacking direction. The first channel body is provided inside the memory film in the first hole. The second stacked body is provided on the first stacked body, and includes a select gate and a second insulating layer provided on the select gate. The gate insulating film is provided on a side wall of a second hole. The second hole is coupled to the first hole and is formed through the second stacked body in a stacking direction. The second channel body is provided inside the gate insulating film in the second hole and is connected with the first channel body. A step part is formed between a side face of the select gate and the second insulating layer. A film thickness of a portion covering the step part of the second channel body is thicker than a film thickness of a portion provided between the second insulating layers of the second channel body.

Embodiments will now be described hereinafter with reference to the accompanying drawings. In the drawings, like elements are marked with like reference numerals.

FIG. 1 is a schematic perspective view of a memory cell array in a semiconductor device 1 of an embodiment. Note that, in FIG. 1, illustration of insulating parts other than an insulating film formed on an inner wall of a memory hole MH is omitted to make the drawing easier to understand.

Figure 2:
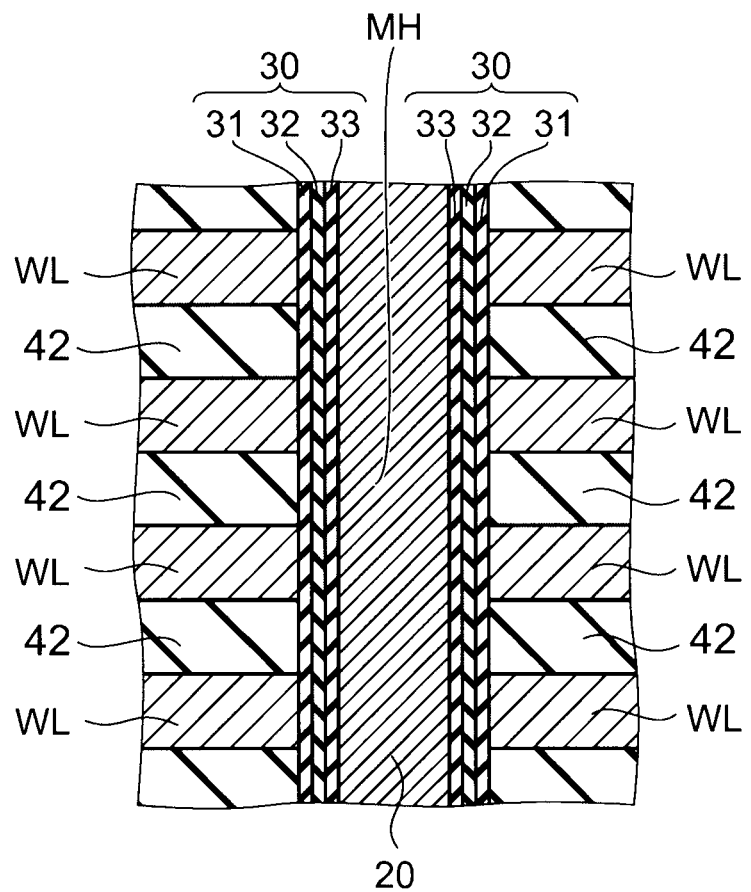
FIG. 2 is an enlarged schematic cross-sectional view of a memory cell in the semiconductor device of the embodiment.

FIG. 2 is an enlarged cross-sectional view of a portion provided with the memory cell in FIG. 1.

In FIG. 1, an XYZ Cartesian coordinate system is introduced for convenience of illustration. In the coordinate system, two directions which are parallel with a major surface of a substrate 10 and perpendicular to each other are defined as an X-direction and a Y-direction, whereas a direction perpendicular to both of the X- and Y-directions is defined as a Z-direction.

In FIG. 1, a back gate BG is provided on the substrate 10 via an insulating layer which is not shown. The back gate BG is a conductive silicon layer having an impurity added therein, for example.

On the back gate BG, a plurality of insulating layers 42 (shown in FIG. 2) and a plurality of electrode layers WL1D, WL2D, WL3D, WL4D, WL1S, WL2S, WL3S and WL4S are stacked alternately on each other.

The electrode layer WL1D and the electrode layer WL1S, which are provided in the same hierarchy, represent the first electrode layer from the bottom. The electrode layer WL2D and the electrode layer WL2S, which are provided in the same hierarchy, represent the second electrode layer from the bottom. The electrode layer WL3D and the electrode layer WL3S, which are provided in the same hierarchy, represent the third electrode layer from the bottom. The electrode layer WL4D and the electrode layer WL4S, which are provided in the same hierarchy, represent the fourth electrode layer from the bottom.

The electrode layer WL1D and the electrode layer WL1S are separated in the Y-direction. The electrode layer WL2D and the electrode layer WL2S are separated in the Y-direction. The electrode layer WL3D and the electrode layer WL3S are separated in the Y-direction. The electrode layer WL4D and the electrode layer WL4S are separated in the Y-direction.

An insulator 45 shown in FIGS. 4B to 5B is provided between the electrode layer WL1D and the electrode layer WL1S, between the electrode layer WL2D and the electrode layer WL2S, between the electrode layer WL3D and the electrode layer WL3S, and between the electrode layer WL4D and the electrode layer WL4S.

The electrode layers WL1D to WL4D are provided between the back gate BG and a drain side select gate SGD. The electrode layers WL1S to WL4S are provided between the back gate BG and a source side select gate SGS.

The number of electrode layers is arbitrary, and not limited to four as illustrated in FIG. 1. Additionally, in the following description, each of the electrode layers WL1D to WL4D and WL1S to WL4S may be simply denoted as the electrode layer WL.

The electrode layer WL is a conductive silicon layer having an impurity added therein, for example. The insulating layer 42 is a tetraethoxysilane (TEOS) layer containing silicon oxide, for example.

The drain side select gate SGD is provided on the electrode layer WL4D. The drain side select gate SGD is a conductive silicon layer having an impurity added therein, for example.

The source side select gate SGS is provided on the electrode layer WL4S. The source side select gate SGS is a conductive silicon layer having an impurity added therein, for example.

The drain side select gate SGD and the source side select gate SGS are separated in the Y-direction. Note that, in the following description, the drain side select gate SGD and the source side select gate SGS may be simply denoted as a select gate SG without being distinguished from each other.

A source line SL is provided on the source side select gate SGS. The source line SL is a metal layer.

A plurality of bit lines BL are provided on the drain side select gate SGD and the source line SL. Each bit line BL extends in the Y-direction.

A plurality of U-shaped memory holes MH are formed on the back gate BG and a stacked body on the back gate BG. In the electrode layers WL1D to WL4D and the drain side select gate SGD, there is formed a through hole penetrating them and extending in the Z-direction. In the electrode layers WL1S to WL4S and the source side select gate SGS, there is formed a through hole punching through them and extending in the Z-direction. The pair of holes extending in the Z-direction are connected via a depression 81 (shown in FIG. 5B) formed in the back gate BG to compose the U-shaped memory hole MH.

Channel bodies 20 and 51 are provided inside the memory hole MH in a U-shaped manner. The channel bodies 20 and 51 are silicon films, for example. A memory film 30 is provided between the channel body 20 and the inner wall of the memory hole MH.

A gate insulating film GD is provided between the drain side select gate SGD and the channel body 51, and between the source side select gate SGS and the channel body 51.

Note that, without being limited to the structure in which the entire memory hole MH is filled with the channel body in FIG. 1, the channel body may be formed so that a hollow part remains on the center axis side of the memory hole MH. Alternatively, there may be a structure having an insulator buried in the hollow part inside the channel body.

A block film 31 as a first insulating film, a charge storage film 32, and a tunnel film 33 as a second insulating film are provided, as shown in FIG. 2, in sequence from the electrode layer WL side, between each electrode layer WL and the channel body 20 in a memory cell transistor (simply referred to as a memory cell in the following). The block film 31 is in contact with the electrode layer WL, the tunnel film 33 is in contact with the channel body 20, and the charge storage film 32 is provided between the block film 31 and the tunnel film 33.

The channel body 20 functions as a channel in the memory cell transistor, the electrode layer WL functions as a control gate, and the charge storage film 32 functions as a data memory layer which accumulates electric charge injected from the channel body 20. In other words, a memory cell having a structure with the control gate surrounding the periphery of the channel is formed at the intersection between the channel body 20 and each electrode layer WL.

The semiconductor device 1 of an embodiment is a non-volatile semiconductor memory device which can freely erase or write data electrically, and can hold the memory content even if the power is shut down.

The memory cell is a charge-trapping memory cell, for example. The charge storage film 32, having a large number of trap sites which capture electric charge, is a silicon nitride film, for example.

The tunnel film 33, which is a silicon oxide film for example, serves as an electrical potential barrier when electric charge is injected from the channel body 20 to the charge storage film 32, or electric charge accumulated on the charge storage film 32 diffuses to the channel body 20.

The block film 31, which is a silicon oxide film, for example, prevents electric charge accumulated on the charge storage film 32 from diffusing to the electrode layer WL.

The drain side select gate SGD, the channel body 51, and the gate insulating film GD therebetween compose a drain side select transistor STD. The channel body 51 at the drain side select transistor STD is connected to the bit line BL.

The source side select gate SGS, the channel body 51, and the gate insulating film GD therebetween compose a source side select transistor STS. The channel body 51 at the source side select transistor STS is connected to the source line SL.

Note that, in the following description, the drain side select transistor STD and the source side select transistor STS may be simply denoted as a select transistor ST without being distinguished from each other.

The back gate BG, the channel body 20 provided in the back gate BG, and the memory film 30 compose a back gate transistor BGT.

A plurality of memory cells MC having the electrode layers WL4D to WL1D as the control gate are provided between the drain side select transistor STD and the back gate transistor BGT. Similarly, a plurality of memory cells MC having the electrode layers WL1S to WL4S as the control gate are provided also between the back gate transistor BGT and the source side select transistor STS.

The plurality of memory cells MC, the drain side select transistor STS, the back gate transistor BGT, and the source side select transistor STS are connected in series through the channel bodies 20 and 51 to compose a single U-shaped memory string MS.

A single memory string MS is buried in a pair of column-shaped parts CL extending in the stacking direction of the stacked body including a plurality of electrode layers WL and the back gate BG, and has a joint part JP which joins the lower end of the pair of the column-shaped parts CL. With a plurality of memory strings MS being arranged in the X- and Y-directions, a plurality of memory cells MC are provided in the X-, Y-, and Z-directions in a three-dimensional manner.

The memory strings MS are provided in a memory cell array region in the substrate 10. A peripheral circuit which controls the memory cell array is provided in the circumference, for example, of the memory cell array region in the substrate 10.

Next, a method for manufacturing the semiconductor device 1 of an embodiment will be described, referring to FIGS. 3A to 5B. In the following description, a method for forming the memory cell array will be described.

Figure 3A:
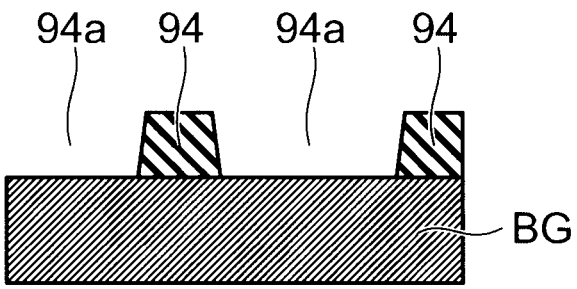
FIGS. 3A to 9B are schematic cross-sectional views showing a method for manufacturing the semiconductor device of the embodiment.

The back gate BG is provided on the substrate 10 via an unshown insulating layer. The back gate BG is a silicon layer having an impurity such as boron doped therein, for example. A resist 94 is formed on the back gate BG, as shown in FIG. 3A. The resist 94 has an opening 94a which has been patterned and selectively formed.

Figure 3B:
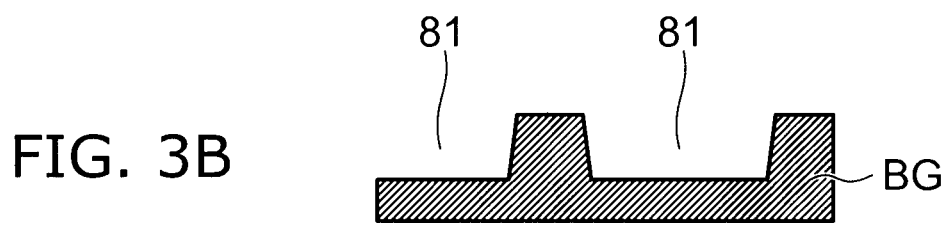

Next, the back gate BG is selectively dry etched, with the resist 94 as a mask. Accordingly, as shown in FIG. 3B, the depression 81 is formed on the back gate BG.

Figure 3C:
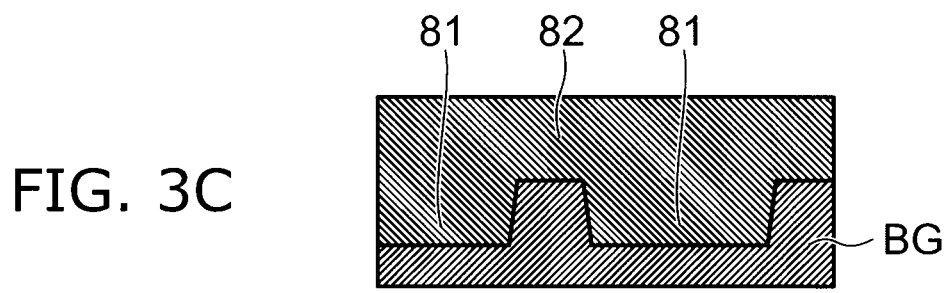
Figure 3D:
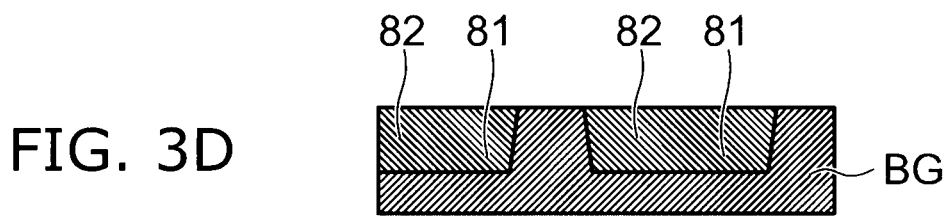

Next, as shown in FIG. 3C, a sacrifice film 82 is buried in the depression 81. The sacrifice film 82 is, for example, a silicon nitride film, a non-doped silicon film or the like. Subsequently, the entire surface of the sacrifice film 82 is etched and, as shown in FIG. 3D, the surface of the back gate BG between the depressions 81 is exposed.

Figure 4A:
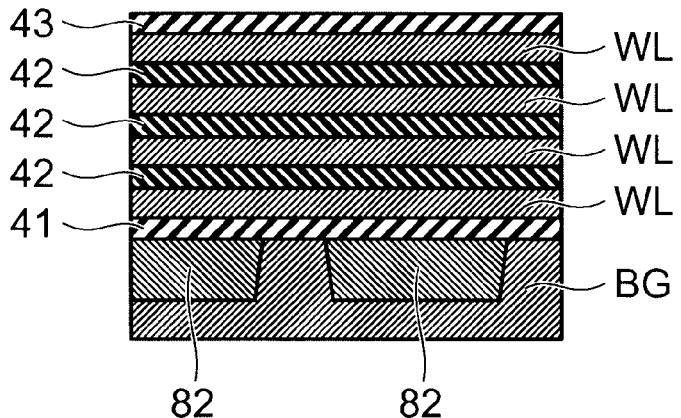

Next, as shown in FIG. 4A, after the insulating film 41 is formed on the back gate BG, a first stacked body including the electrode layers WL and the insulating layers 42 is formed thereon. The electrode layers WL and insulating layers 42 are alternately stacked on each other, so that the insulating layer is interposed between the electrode layers WL. An insulating film 43 is formed on the uppermost electrode layer WL.

Figure 4B:
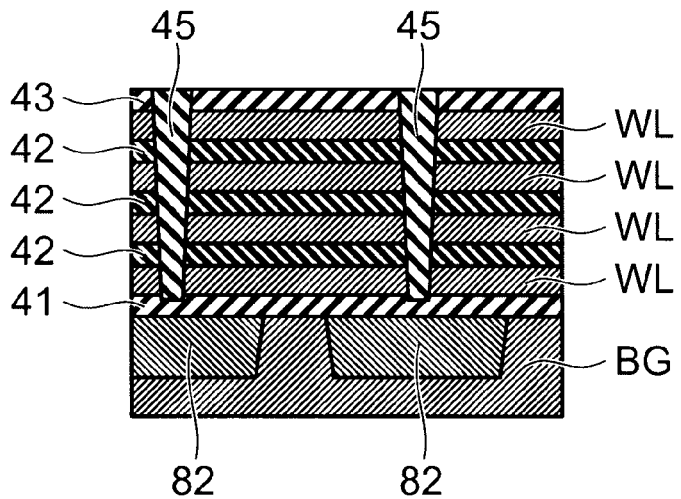

Next, after the first stacked body is separated and a groove which reaches the insulating film 41 is formed by photolithography and etching, the groove is filled with an insulating film 45, as shown in FIG. 4B.

Figure 4C:
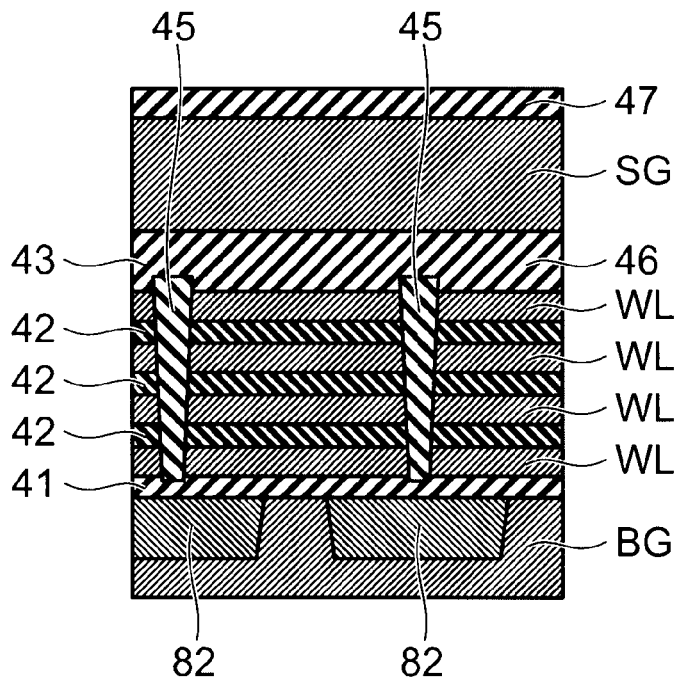

After the groove is filled with the insulating film 45, the insulating film 43 is exposed by overall etching. As shown in FIG. 4C, an insulating film 46 is formed on the insulating film 43. Furthermore, a second stacked body including the select gate SG and an insulating layer 47 is formed on the insulating film 46. The select gate SG is formed on the insulating film 46, and the insulating layer 47 is formed on the select gate SG.

Figure 5A:
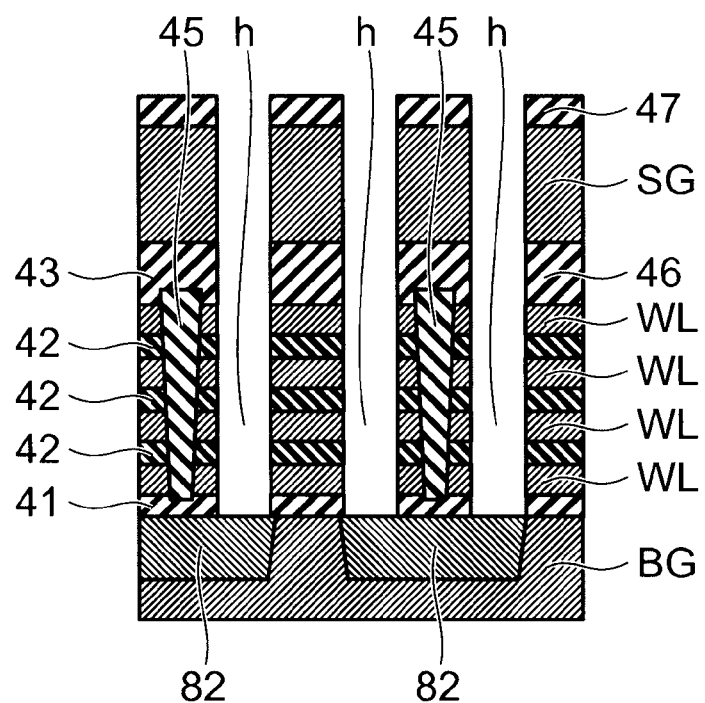

Next, as shown in FIG. 5A, a hole h is formed in the first and second stacked bodies on the back gate BG. The hole h is formed by Reactive Ion Etching (RIE), for example, using an unshown mask. The lower end of the hole h reaches the sacrifice film 82, and thus the sacrifice film 82 is exposed at the bottom of the hole h. A pair of holes h are located on the single sacrifice film 82 so as to sandwich the insulating film 45 located substantially at the center of the sacrifice film 82.

Next, the sacrifice film 82 is removed through the hole h by wet etching, for example. Alkaline solution such as KOH (potassium hydroxide) solution, or phosphoric acid solution ($H_3PO_4$) having an adjusted etching rate depending on temperature condition, for example, can be used as the etchant in this occasion.

Figure 5B:
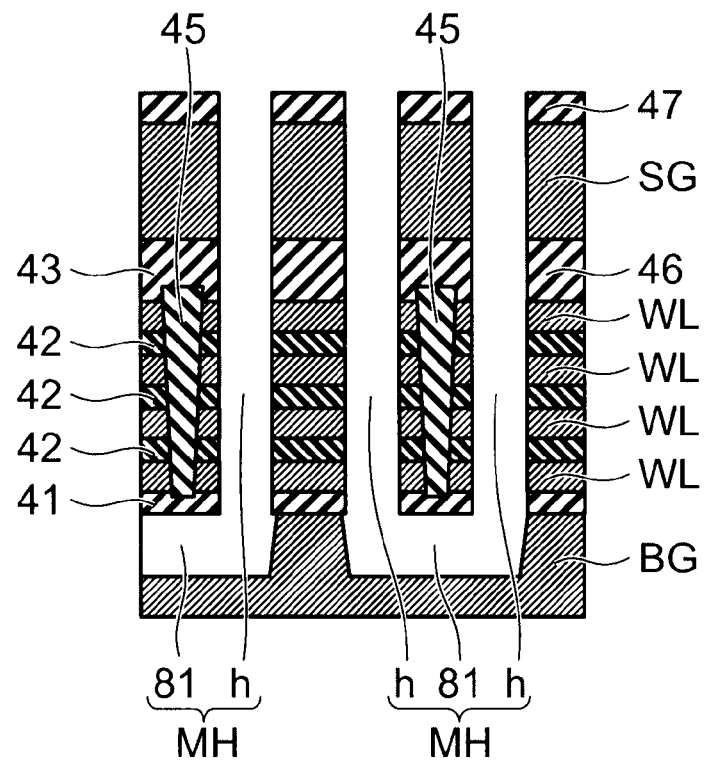

Accordingly, the sacrifice film 82 is removed, as shown in FIG. 5B. Removal of the sacrifice film 82 causes the depression 81 to be formed in the back gate BG. Each one of the depressions 81A has a pair of holes h connected thereto. In other words, the lower end of each one of the pair of holes h is connected to a common depression 81, forming a single U-shaped memory hole MH.

Subsequently, the memory film 30 shown in FIG. 2 is formed on the inner wall of the memory hole MH in the first stacked body including the electrode layers WL. Furthermore, a silicon film is formed inside the memory film 30 in the memory hole MH as the channel body (first channel body) 20.

Figure 6A:
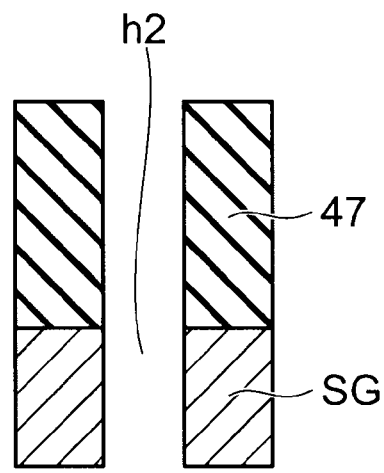

On the other hand, processes of and subsequent to FIG. 6A are performed on the second stacked body including the select gate SG as will be described below.

In the semiconductor device 1 of the embodiment, the data erase operation is an operation of extracting electrons from the charge storage film 32 or injecting positive holes into the charge storage film 32. A transistor composing the memory cell MC with the electrode layer WL as the control gate has a state in which the threshold voltage is relatively low (erase state) and a state in which the threshold voltage is relatively high (write state). The erase operation is an operation of setting the threshold voltage of the memory cell MC to the lower state.

In a memory having a general two-dimensional structure, electrons that have been written in the floating gate are extracted by raising the substrate potential. In a semiconductor device having a three-dimensional structure as in the embodiment, however, the channel of the memory cell is not directly connected to the substrate. Therefore a method for boosting the channel potential of the memory cell using Gate Induced Drain Leakage (GIDL) current that occurs in the channel at the select gate edge has been proposed.

In other words, a high electric field is generated in a depletion layer formed between the select gates SG and the diffusion region by applying high voltage to the diffusion region which is formed in the channel body 51 near the upper end of the select gate SG and has high-concentration impurity added thereto. Accordingly, the channel potential is raised by causing interband tunneling and supplying the generated positive holes to the channel bodies 51 and 20. The potential difference between the channel body 20 and the electrode layer WL due to setting the potential of the electrode layer WL to the ground potential (OV), for example, causes extraction of electrons of the charge storage film 32, or injection of positive holes into the charge storage film 32, and thus the erase operation is performed.

In order to raise the speed of such an erase operation, a diffusion region containing the high-concentration impurity is required in the channel body 51 near the upper end of the select gate SG.

A method for forming the select transistor ST and the structure thereof in the embodiment will be described below, referring to FIGS. 6A to 9B.

The process described below is performed after the memory hole MH shown in FIG. 5B is formed. Note that, particularly in the memory hole MH, the portion penetrating the second stacked body including the select gate SG and the insulating layer 47 is defined as the hole h2.

FIG. 6A indicates a state in which the hole h2 has been formed in the second stacked body.

Subsequent to the formation of the hole h2, processing using dilute hydrofluoric acid, for example, is performed. The silicon oxide insulating layer 47 is etched in the process. In addition, the dilute hydrofluoric acid process performs both removal of the deposited material due to RIE when forming the hole h2, and pre-formation processing of the gate insulating film GD.

Figure 6B:
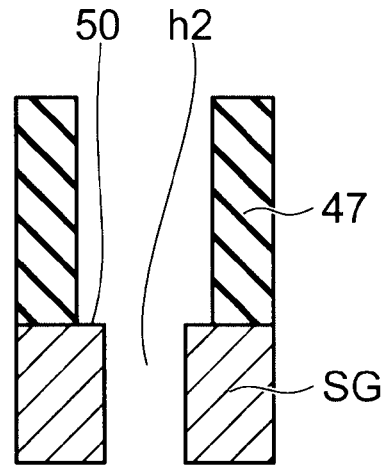

As shown in FIG. 6B, etching causes the insulating layer 47 to retreat in the direction along which the side wall exposed at the hole h2 moves away from the central axis of the hole h2. For example, the amount that the side wall of the insulating layer 47 retreats is about 5 (nm). Therefore, the hole diameter of the hole h2 between the insulating layers 47 is larger than the hole diameter between the select gates SG. Accordingly, a step part 50 is formed between the side face of the select gate SG and the insulating layer 47.

Figure 6C:
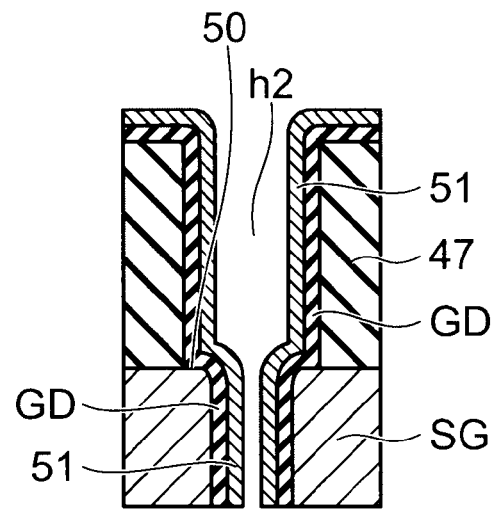

Next, as shown in FIG. 6C, the gate insulating film GD is formed on the side wall of the hole h2. The gate insulating film GD covers the step part 50 along the step part 50, also forming a step part on the gate insulating film GD. The gate insulating film GD is a silicon oxide film or a silicon nitride film formed by chemical vapor deposition (CVD) method, for example.

Next, an amorphous silicon film which serves as a channel body (second channel body) 51 is formed inside the gate insulating film GD in the hole h2 by the CVD method, for example. Subsequently, the amorphous silicon film is crystallized by a heat treatment to form a polycrystalline silicon film.

The channel body 51 is connected to the channel body 20 in the memory cell. The channel body 51 covers the step part 50 with the gate insulating film GD interposed therebetween, and thereby a step part is also formed on the channel body 51.

Next, an impurity is implanted into the channel body 51 by ion implant. For example, arsenic (As) which is an n-type impurity is implanted with a dose amount not less than $5 \times 10^{14}/cm^2$ and an acceleration voltage of 10 keV.

In the channel body 51, a portion covering the step part 50 between the side face of the select gate SG and the insulating layer 47 is formed so as to follow the step part 50, and protrudes toward the central axis of the hole h2. Accordingly, the efficiency of impurity injection into the portion covering the step part 50 becomes higher than into the side face of the channel body 51 formed on the side wall of the hole h2 between the insulating layers 47. Therefore, the portion covering the step part 50 in the channel body 51 contains impurity with a higher concentration than other parts.

After the implantation of impurity into the channel body 51, a heat treatment (annealing) is performed in $N_2$ gas atmosphere at 1000° C. for 10 seconds, for example.

Ion implant causes the density of arsenic in the portion covering the step part 50 in the channel body 51 to be higher than other parts, resulting in volume expansion of the step part 50, and subsequent annealing causes further volume expansion. The volume of the channel body 51 after the ion implant and annealing expands by approximately two or three times, for example.

Figure 7A:
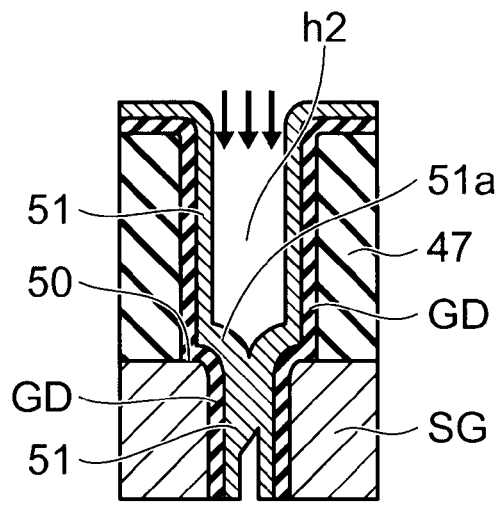

As shown in FIG. 7A, the film thickness of a portion (volume expansion part) 51a covering the step part 50 in the channel body 51 becomes thicker than the film thickness of the part provided between the insulating layers 47. The volume expansion part 51a of the channel body 51 blocks the hole h2 near the step part 50.

The film thickness when forming the film of the channel body 51 capable of blocking the hole h2 with its volume expansion depends on the hole diameter of the hole h2 and the film thickness of the gate insulating film GD. The smaller the hole diameter of the hole h2, the smaller the thickness of the channel body 51 capable of blocking the hole h2 with its volume expansion becomes. The larger the film thickness of the gate insulating film GD, the smaller the film thickness of the channel body 51 capable of blocking the hole h2 with its volume expansion becomes.

Note that, the type of ion implanted into the channel body 51 is not limited to arsenic and may be carbon (C) or phosphorus (P), where ion implant is notably performed with a dose amount not less than $5 \times 10^{14}/cm^2$ in either case.

Figure 7B:
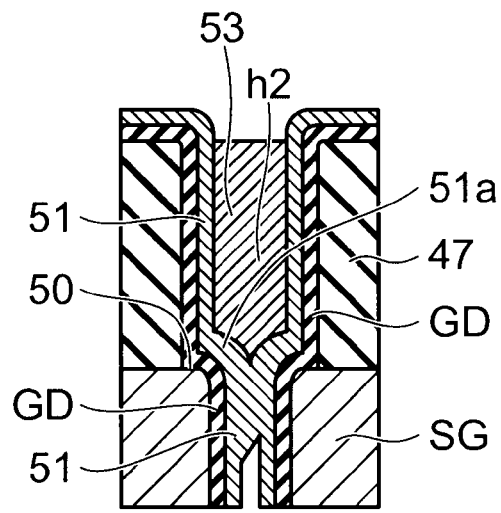
Figure 7C:
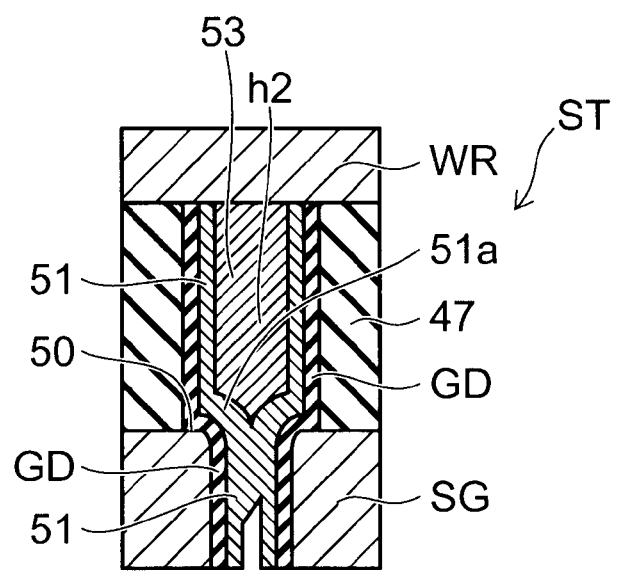

Next, as shown in FIG. 7B, a semiconductor 53 containing an impurity is buried inside the channel body 51 above the portion blocked by the volume expansion part 51a of the channel body 51, i.e., above the select gate SG.

For example, amorphous silicon having phosphorus doped therein with a dose amount not less than $1 \times 10^{20}/cm^2$ is buried in the hole h2 above the volume expansion region 51a.

After having removed the gate insulating film GD, the channel body 51, and the semiconductor 53 on the top surface of the insulating layer 47 by RIE (Reactive Ion Etching), the semiconductor 53 is turned into polycrystalline silicon by a heat treatment. In other words, the semiconductor 53 turns into polycrystalline silicon having phosphorus doped therein as an impurity, for example. Subsequently, an interconnect WR is formed on the second stacked body to server as the bit line BL or the source line SL. The channel body 51 and the semiconductor 53 are electrically connected to the interconnect WR.

The semiconductor 53 is in contact with the channel body 51 above the volume expansion part 51a in the channel body 51. The impurity (e.g., phosphorus) doped in the semiconductor 53 is diffused in the channel body 51 by applying a heat treatment after the burying of the semiconductor 53.

The impurity concentration of the volume expansion part 51a already having the impurity doped therein by the above-mentioned ion implant further rises due to diffusion of the impurity from the semiconductor 53. The volume expansion part 51a is provided in the portion covering the step part 50 between the side face of the select gate SG and the insulating layer 47. In the embodiment, therefore, a diffusion region containing an impurity with a high concentration exists in the channel body 51 near the upper end of the select gate SG. As a result, the channel potential of the memory cell can be quickly boosted using the above-mentioned GIDL current, whereby the speed of erase operation can be increased.

The impurity from the semiconductor 53 is also diffused in the channel body 51 formed on the side wall of the hole h2 above the volume expansion part 51a. As a result, the resistance of the upper part connected to the interconnect WR in the channel body 51 can be reduced, whereby the cell current at the read operation can be increased.

The impurity concentration of the volume expansion part 51a and the channel body 51 on the volume expansion part 51a is, for example, $5 \times 10^{19}/cm^3$ or more, and is higher than the impurity concentration of the channel body 51 lower than the volume expansion part 51a.

Note that, as a comparative example, a method is provided which, after the process of FIG. 6C, buries an insulating film (a silicon nitride film or a silicon oxide film) in the hole h2, performs a recess process that removes the insulating film as far as near the upper end of the select gate SG by etching, and buries an impurity-doped semiconductor in the portion where the insulating film has been removed. Also in this case, an impurity can be supplied on a channel body by diffusion of the impurity from the semiconductor.

However, a seam or void may easily occur in the insulating film at a location such as an interval between the select gates SG where the hole diameter is narrow, and thus their existence lowers the controllability of stopping etching of the insulating film near the upper end of the select gate SG. In other words, if etching of the insulating film reaches the seam or void, the seam or void may be expanded, which may result in formation of a relatively large gap or hollow in the insulating film between the select gates SG. Burying an impurity-doped semiconductor therein may result in the impurity-doped semiconductor getting in as far as the channel body of the select transistor and the memory cell, which may cause threshold lowering or breakdown voltage failure of the select transistor and the memory cell.

On the contrary, in the embodiment as shown in FIG. 7A, the hole h2 is blocked near the upper end of the select gate SG by volume expansion of the channel body 51. Accordingly, the impurity-doped semiconductor 53 can be formed near the upper end of the select gate SG with a good position controllability, without getting into the channel body of the select gate SG and the channel body of the memory cell transistor located further below.

As a result, breakdown voltage failure of the gate insulating film GD caused by exposing the gate insulating film GD between the select gates SG to high-concentration impurity, and threshold lowering caused by supplying high-concentration impurity to the channel body of the select transistor and the memory cell transistor can be prevented.

Next, another method for forming the select transistor ST and its structure will be described, referring to FIGS. 8A to 8C.

After the processes up to that shown in FIG. 6C have been performed as with the specific examples mentioned above, impurity such as arsenic, phosphorus, carbon, for example, is implanted into the channel body 51 by ion implant. Annealing is then performed subsequent to the implantation of impurity into the channel body 51.

In the channel body 51, the portion covering the step part 50 between the side face of the select gate SG and the insulating layer 47 is formed so as to follow the step part 50, and protrudes toward the central axis of the hole h2. Accordingly, the efficiency of impurity implantation into the portion covering the step part 50 becomes higher than into the side face of the channel body 51 formed on the side wall of the hole h2 between the insulating layers 47. Therefore, the portion covering the step part 50 in the channel body 51 contains an impurity with a higher concentration than other parts.

The portion covering the step part 50 in the channel body 51 has a higher impurity density than other parts due to ion implant, which results in an expanded volume, and subsequent annealing causes further volume expansion.

Figure 8A:
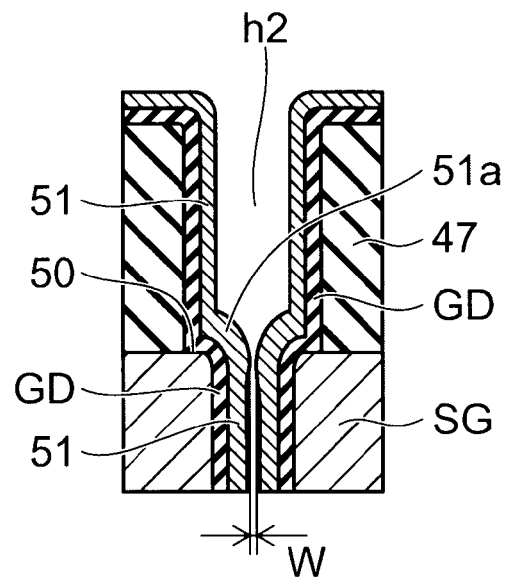

As shown in FIG. 8A, the film thickness of the portion (volume expansion part) 51a covering the step part 50 becomes thicker than the film thickness of the portion provided between the insulating layers 47 in the channel body 51.

Note that in the specific example, the above-mentioned annealing is performed at a low temperature in comparison with the embodiment initially shown. Accordingly, the volume expansion part 51a of the channel body 51 does not exhibit as much volume expansion as necessary to block the hole h2. Therefore, a hollow or gap exists on the central axis side of the hole h2 inside the volume expansion part 51a.

The radial direction size W of the hollow depends on the hole diameter of the hole h2, the film thickness of the gate insulating film GD, and the film thickness of the channel body 51.

The impurity implanted by ion implant can be suppressed from diffusing in the channel body 51 between the select gates SG, by suppressing the temperature of the above-mentioned annealing so that the volume expansion part 51a does not exhibit as much volume expansion as necessary to block the hole h2. Accordingly, off leak current Ioff can be suppressed by enhancing the cut-off characteristic of the select transistor.

Figure 8B:
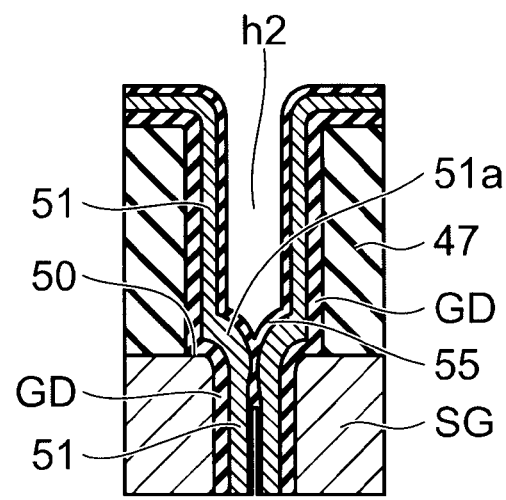

Next, as shown in FIG. 8B, an insulating film 55 is formed inside the channel body 51 in the hole h2. The insulating film 55 is a silicon oxide film or a silicon nitride film formed by Atomic Layer Deposition (ALD), for example. The insulating film 55 is buried in a hollow inside the volume expansion part 51a in the hole h2, and blocks the hollow inside the volume expansion part 51a.

For example, if the radial direction size W(nm) of the hollow between the volume expansion parts 51a in FIG. 8A is 3 (nm)<W<10 (nm), the hollow can be blocked by making the film thickness of the insulating film 55 not less than 5 (nm).

Since the ALD method exhibits good coverage characteristics for thin films, and the hole diameter of the hole h2 between the insulating layers 47 is wider than the hole diameter of the hole h2 between the select gates SG, the hole h2 between the insulating layers 47 is not filled with the insulating film 55a and the hollow remains.

In addition, the insulating film 55 is also formed inside the channel body 51 between the select gates SG below the blocked part, with a hollow slightly remaining inside the insulating film 55.

Next, isotropic etching is performed on the insulating film 55 so as to selectively remove the insulating film 55 exposed at the side wall of the hole h2 between the insulating layers 47, while performing as little etching as possible on the insulating film 55 buried between the volume expansion parts 51a.

For example, if there is a seam in the insulating film 55 when removing the insulating film 55 by wet etching using dilute hydrofluoric acid, the etching rate becomes fast at the part of the seam, and thus over etching in the depth direction of the insulating film 55 blocking the interval between the volume expansion regions 51a is concerned.

In other words, there is a concern that, if the seam of the insulating film 55 is expanded by wet etching and overly etched in the depth direction, the impurity-doped semiconductor 53 formed in the subsequent process gets in as far as the channel body 51 between the select gates SG, which may lead to drop of the threshold value of the select transistor and disabled cut-off.

For example, the insulating film 55 can be selectively etched with a good controllability by forming $NH_4F$ in a thermochemical reaction using annealing after having formed a thin film containing $NF_3$ and $NH_3$ on the insulating film 55.

Figure 8C:
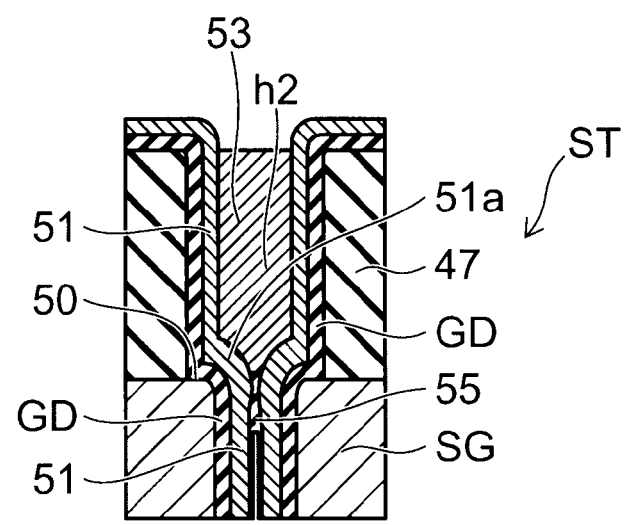

Accordingly, the insulating film 55 still remains inside the channel body 51 between the volume expansion parts 51a and between the select gates SG, as shown in FIG. 8C, after having removed the insulating film 55 on the side wall of the hole h2 between the insulating layers 47.

As a result, the impurity-doped semiconductor 53 does not contact the channel body 51 between the select gates SG, the threshold value of the select transistor does not drop, and therefore the off leak current of a transistor is not increased.

After having removed the insulating film 55 on the side wall of the hole h2 between the insulating layers 47, the impurity-doped semiconductor 53 is buried, as shown in FIG. 8C, inside the channel body 51 above the portion where the insulating film 55 blocks the hole h2, i.e., in the hole h2 above the select gate SG.

The semiconductor 53 is in contact with the channel body 51 above the portion blocked by the insulating film 55. The impurity (e.g., phosphorus) doped in the semiconductor 53 is diffused in the channel body 51 by applying a heat treatment after the burying of the semiconductor 53.

The impurity concentration of the volume expansion part 51a already having the impurity doped therein by the above-mentioned ion injection further rises due to diffusion of the impurity from the semiconductor 53. The volume expansion part 51a is provided in the portion covering the step part 50 between the side face of the select gate SG and the insulating layer 47. In the specific example, therefore, a diffusion region containing the high-concentration impurity exists in the channel body 51 near the upper end of the select gate SG. As a result, the channel potential of the memory cell can be quickly boosted using the above-mentioned GIDL current, whereby the erase operation can be speeded up.

In addition, the impurity from the semiconductor 53 is also diffused in the channel body 51 formed on the side wall of the hole h2 above the volume expansion part 51a. As a result, the resistance of the upper part connected to the upper layer interconnect in the channel body 51 can be reduced, whereby the cell current at the read operation can be increased.

The impurity concentration of the volume expansion part 51a and the channel body 51 on the volume expansion part 51a is, for example, $5 \times 10^{19}/cm^3$ or more, and is higher than the impurity concentration of the channel body 51 lower than the volume expansion part 51a.

Furthermore, the hole h2 is blocked near the upper end of the select gate SG by volume expansion of the channel body 51 and the insulating film 55. Accordingly, the impurity-doped semiconductor 53 can be formed near the upper end of the select gate SG with good position controllability, without getting into the channel body of the select gate SG and the channel body of the memory cell transistor located further below.

As a result, breakdown voltage failure of the gate insulating film GD caused by exposing the gate insulating film GD between the select gates SG to high-concentration impurity, and threshold lowering caused by supplying high-concentration impurity to the channel body of the select transistor and the memory cell transistor can be prevented.

In addition, since the insulating film 55 covers inside the channel body 51 of the select transistor and the channel body 20 of the memory cell transistor located further below, the channel bodies 51 and 20 can be protected from, for example, dilute hydrofluoric acid used in preprocessing before forming the impurity-doped semiconductor 53.

Next, still another method for forming the select transistor ST and its structure will be described, referring to FIGS. 9A and 9B.

After the processes up to that shown in FIG. 6C have been performed as with the specific examples mentioned above, an impurity such as arsenic, phosphorus, carbon, for example, is implanted into the channel body 51 by ion implant. Annealing is then performed subsequent to the implantation of impurity into the channel body 51.

In the channel body 51, the portion covering the step part 50 between the side face of the select gate SG and the insulating layer 47 is formed so as to follow the step part 50, and protrudes toward the central axis of the hole h2. Accordingly, the efficiency of impurity injection into the portion covering the step part 50 becomes higher than into the side face of the channel body 51 formed on the side wall of the hole h2 between the insulating layers 47. Therefore, the portion covering the step part 50 in the channel body 51 contains an impurity with a higher concentration than other parts.

Figure 9A:
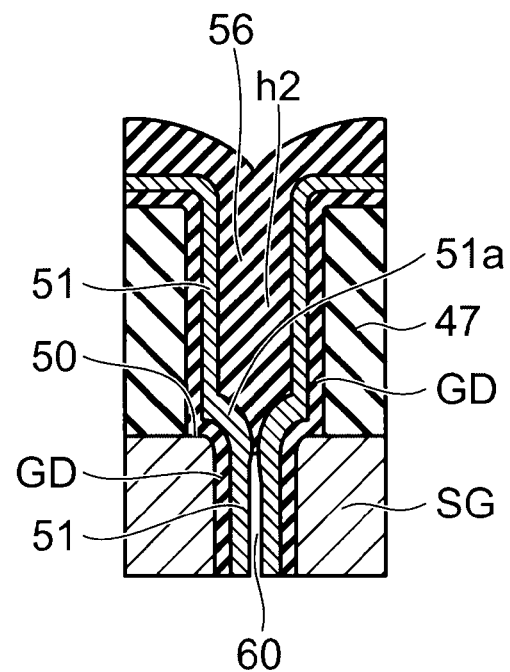

Ion implant causes the impurity density in the portion covering the step part 50 in the channel body 51 to be higher than other parts, resulting in volume expansion of the step part 50, and subsequent annealing causes further volume expansion As shown in FIG. 9A, the film thickness of the portion (volume expansion part) 51a covering the step part 50 becomes thicker than the film thickness of the portion provided between the insulating layers 47 in the channel body 51.

Note that, in the specific example, the above-mentioned annealing is performed at a low temperature in comparison with the embodiment initially shown. Accordingly, the volume expansion part 51a of the channel body 51 does not exhibit as much volume expansion as necessary to block the hole h2. Therefore, a hollow or gap exists on the central axis side of the hole h2 inside the volume expansion part 51a.

The impurity implanted by ion implant can be prevented from diffusing in the channel body 51 between the select gates SG, by suppressing the temperature of the above-mentioned annealing so that the volume expansion part 51a does not exhibit as much volume expansion as necessary to block the hole h2. Accordingly, off leak current Ioff can be suppressed by enhancing the cut-off characteristic of the select transistor.

Next, as shown in FIG. 9A, an insulating film 56 is formed inside the channel body 51 in the hole h2. The insulating film 56 is a silicon oxide film or a silicon nitride film, for example. The insulating film 56 is buried in a hollow inside the volume expansion part 51a to block the hole h2.

The insulating film 56 is formed by a film forming method which exhibits relatively low coverage characteristics. Accordingly, a portion where the hole diameter between the volume expansion parts 51a is small is first blocked by the insulating film 56, so that the insulating film 56 does not get into the hole h2 between the select gates SG below and the hole h2 of the memory transistor further below. Such an insulating film 56 can be formed by chemical vapor deposition (CVD), physical vapor deposition (PCVD), for example, which can lower the coverage characteristics by adjusting conditions such as the film forming temperature.

The hole h2 between the insulating layers 47 is filled with the insulating film 56. In contrast, the insulating film 56 is not formed inside the channel body 51 between the select gates SG below the portion blocked by the insulating film 56, and thus the hollow 60 remains inside the channel body 51 between the select gates SG and inside the channel body 20 of the memory cell transistor below.

Figure 9B:
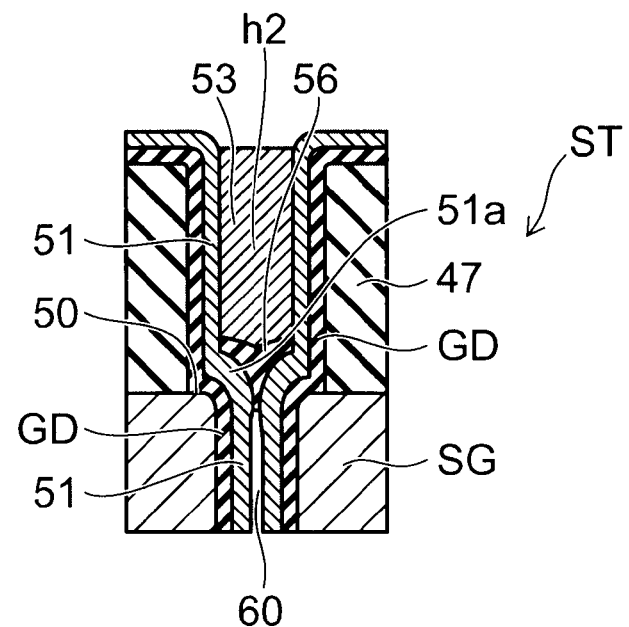

Next, as shown in FIG. 9B, the insulating film 56 above the portion blocking the hole h2 between the volume expansion parts 51a is etched and removed by RIE method, for example. For example, the insulating film 56 is etched to a position about 10 (nm) to 150 (nm) above the upper end of the select gate SG. The insulating film 56 blocking the hole h2 between the volume expansion parts 51a remains.

Next, the impurity-doped semiconductor 53 is buried into the hole h2 on the remaining insulating film 56. The semiconductor 53 is in contact with the channel body 51 above the insulating film 56. Applying a heat treatment after the semiconductor 53 has been buried causes the impurity (e.g., phosphorus) doped in the semiconductor 53 to be diffused in the channel body 51.

Also in the specific example, the volume expansion part 51a containing high-concentration impurity due to ion implant and diffusion of impurity from the semiconductor 53 is provided in the portion covering the step part 50 between the side face of the select gate SG and the insulating layer 47. As a result, the channel potential of the memory cell can be quickly boosted using the above-mentioned GIDL current, whereby the erase operation can be speeded up.

In addition, the impurity from the semiconductor 53 is also diffused in the channel body 51 formed on the side wall of the hole h2 above the insulating film 56. As a result, the resistance of the upper part connected to the upper layer interconnect in the channel body 51 can be reduced, whereby the cell current at the read operation can be increased.

The impurity concentration of the volume expansion part 51a and the channel body 51 on the volume expansion part 51a is, for example, $5 \times 10^{19}/cm^3$ or more, and is higher than the impurity concentration of the channel body 51 lower than the volume expansion part 51a.

Furthermore, the hole h2 is blocked near the upper end of the select gate SG by volume expansion of the channel body 51 and the insulating film 56. Accordingly, the impurity-doped semiconductor 53 can be formed near the upper end of the select gate SG with good position controllability, without getting into the channel body of the select gate SG and the channel body of the memory cell transistor located further below.

As a result, breakdown voltage failure of the gate insulating film GD caused by exposing the gate insulating film GD between the select gates SG to a high-concentration impurity, and threshold lowering caused by supplying high-concentration impurity to the channel body of the select transistor and the memory cell transistor can be prevented.

In addition, the insulating film 56 is not formed and a hollow 60 is formed inside the channel body 51 between the select gates SG and the inside the channel body 20 in the memory cell transistor below.

Accordingly, threshold shift or the like of the select transistor and the memory cell due to charge trap level of the interface between the channel body and the insulating film 56 can be suppressed. As a result, a high reliability can be acquired when performing a read operation or an erase operation.

Figure 10:
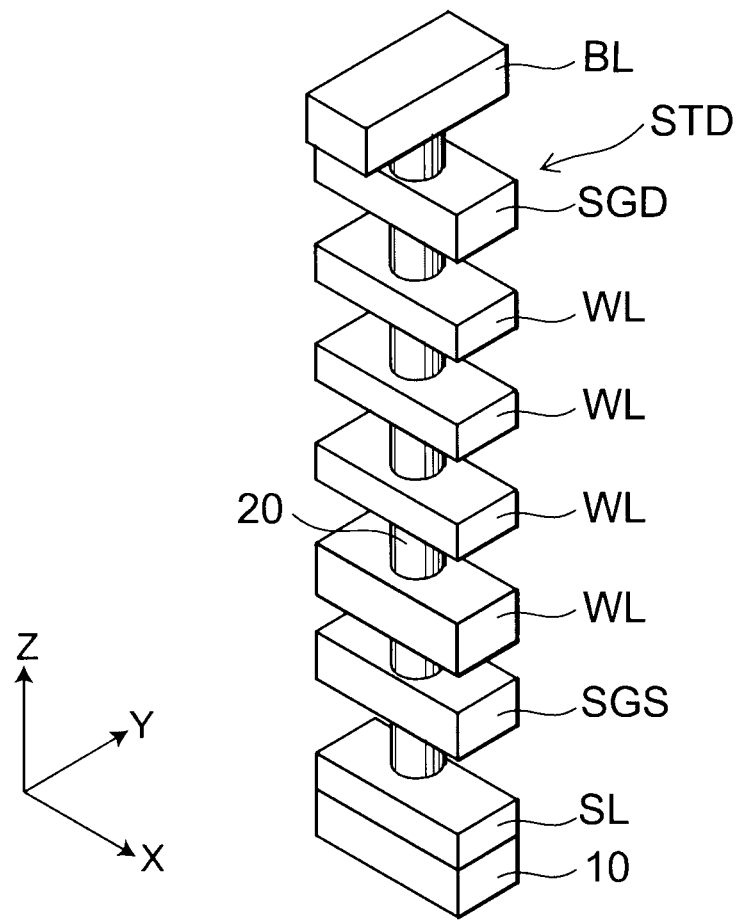
FIG. 10 is a schematic perspective view showing another specific example of the memory string in the semiconductor device of the embodiment.

The memory string is not limited to U-shaped and may be I-shaped, as shown in FIG. 10. FIG. 10 shows only the conductive parts, omitting the insulating parts.

In the structure, the source line SL is provided on the substrate 10, the source side select gate (or the lower part select gate) SGS is provided thereon, a plurality (e.g., four) of electrode layers WL are provided thereon, and the drain side select gate (or the upper part select gate) SGD is provided between the uppermost electrode layer WL and the bit line BL.

In the structure, the processes and structures described above referring to FIGS. 6A to 9B are applied to the drain side select transistor STD provided on the upper end of the memory string.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a substrate;
   a first stacked body including a plurality of electrode layers and a plurality of first insulating layers alternately stacked on each other on the substrate;
   a memory film provided on a side wall of a first hole formed through the first stacked body in a stacking direction;
   a first channel body provided inside the memory film in the first hole;
   a second stacked body provided on the first stacked body, and including a select gate and a second insulating layer provided on the select gate, the select gate provided between the first stacked body and the second insulating layer;
   a gate insulating film provided on a side wall of a second hole which is coupled to the first hole and is formed through the second stacked body in a stacking direction; and
   a second channel body provided inside the gate insulating film in the second hole and connected with the first channel body,
   a step part being formed between a side face of the select gate and the second insulating layer;
   the second channel body having a step part covering the step part formed between the side face of the select gate and the second insulating layer, and a first portion provided inside the second insulating layer;
   the step part of the second channel body containing an impurity; and
   a film thickness of the step part of the second channel body being thicker than a film thickness of the first portion of the second channel body.

2. The device according to claim 1, wherein a hole diameter of the second hole inside the second insulating layers is larger than a hole diameter of the second hole inside the select gates.

3. The device according to claim 1, wherein the step part of the second channel body blocks the second hole.

4. The device according to claim 3, further comprising a semiconductor containing an impurity, the semiconductor provided inside the second channel body above the step part of the second channel body, and provided in contact with the second channel body.

5. The device according to claim 1, further comprising an insulating film provided inside the step part of the second channel body to block the second hole.

6. The device according to claim 5, further comprising a semiconductor containing an impurity, the semiconductor provided inside the second channel body above the insulating film, and provided in contact with the second channel body.

7. The device according to claim 5, wherein a hollow is formed inside the second channel body in the select gates below a portion where the insulating film blocks the second hole.

8. The device according to claim 7, wherein the insulating film is not provided in the hollow, and the second channel body faces the hollow.

9. The device according to claim 5, wherein the insulating film is also provided inside the second channel body in the select gates below a portion where the insulating film blocks the second hole.

10. The device according to claim 9, wherein a hollow is formed inside the insulating film provided inside the second channel body in the select gate.

11. The device according to claim 1, wherein the step part of the second channel body contains the impurity with a higher concentration than other parts of the second channel body.

* * * * *